United States Patent
Hosokawa et al.

(10) Patent No.: US 8,284,563 B2
(45) Date of Patent: Oct. 9, 2012

(54) CIRCUIT STRUCTURE THAT CONNECTS AN ELECTRONIC PART TO A CONDUCTING PATH

(75) Inventors: Tsuyoshi Hosokawa, Yokkaichi (JP); Futoshi Nishida, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 726 days.

(21) Appl. No.: 11/793,531

(22) PCT Filed: Dec. 15, 2005
(Under 37 CFR 1.47)

(86) PCT No.: PCT/JP2005/023071
§ 371 (c)(1),
(2), (4) Date: Jan. 16, 2008

(87) PCT Pub. No.: WO2006/073050
PCT Pub. Date: Jul. 13, 2006

(65) Prior Publication Data
US 2008/0259586 A1    Oct. 23, 2008

(30) Foreign Application Priority Data
Jan. 5, 2005    (JP) .................................. 2005-000964

(51) Int. Cl.
*H01R 9/00*    (2006.01)

(52) U.S. Cl. ........................................ 361/775
(58) Field of Classification Search .................. 361/775, 361/675; 174/70, 96–98
See application file for complete search history.

(56) References Cited

U.S. PATENT DOCUMENTS

| | | | |
|---|---|---|---|
| 4,079,435 A * | 3/1978 | Zaslavskaya et al. | 361/82 |
| 5,866,850 A * | 2/1999 | Kobayashi | 174/98 |
| 6,291,897 B1 * | 9/2001 | Wark et al. | 257/786 |
| 6,797,880 B2 * | 9/2004 | Kirchberger et al. | 174/548 |
| 6,888,072 B2 * | 5/2005 | Tsukamoto et al. | 174/260 |
| 7,167,377 B2 * | 1/2007 | Onizuka et al. | 361/775 |
| 2002/0030036 A1 | 3/2002 | Kasai | |
| 2003/0137813 A1 | 7/2003 | Onizuka et al. | |
| 2003/0142450 A1* | 7/2003 | Bo | 361/62 |
| 2005/0111166 A1* | 5/2005 | Kita | 361/624 |

(Continued)

FOREIGN PATENT DOCUMENTS

DE    102 54 910 A1    7/2003

(Continued)

*Primary Examiner* — Jeremy Norris
*Assistant Examiner* — Tremesha S Willis
(74) *Attorney, Agent, or Firm* — Oliff & Berridge, PLC

(57) ABSTRACT

There is provided a circuit structure in which a control circuit is formed on the upper surface of an insulating plate 14 by control busbars 15, and a power circuit is formed on the lower surface of the insulating plate 14 by power busbars 18. By this configuration, the circuit structure can be made small in size as compared with the case where the control circuit and the power circuit are formed on separate circuit boards. Also, the insulating plate 14 is formed with an opening 23, and a power busbar 18 is positioned over the opening 23. In the opening 23, a terminal 25B of a relay 16 is positioned, and is connected to the power busbar 18. Thereby, the connecting work process can be simplified as compared with the case where the power circuit and the terminal 25B of the relay 16 are connected to each other, for example, by a jumper wire.

8 Claims, 9 Drawing Sheets

U.S. PATENT DOCUMENTS

2005/0221642 A1 * 10/2005 Saka .................... 439/76.2

FOREIGN PATENT DOCUMENTS

| | | |
|---|---|---|
| DE | 103 03 253 A1 | 7/2003 |
| EP | 1 186 478 A3 | 3/2002 |
| JP | U 64-29792 | 2/1989 |
| JP | A 6-97622 | 4/1994 |
| JP | A 10-35375 | 2/1998 |
| JP | A 2002-95134 | 3/2002 |
| JP | A 2003-2113 | 1/2003 |
| JP | A 2003-164039 | 6/2003 |
| JP | A 2003-224918 | 8/2003 |

* cited by examiner

CIRCUIT STRUCTURE THAT CONNECTS AN ELECTRONIC PART TO A CONDUCTING PATH

TECHNICAL FIELD

The present invention relates to a circuit structure.

BACKGROUND

Conventionally, there has been known an electrical junction box in which a circuit structure is formed by electrically connecting two different circuit boards to each other and is housed in a housing (refer to Patent Document 1).
[Patent Document 1] Japanese Patent Laid-Open No. 10-35375

To decrease the size of the circuit structure configured as described above, it is conceivable that each of circuits corresponding to the circuits formed on the two circuit boards is formed on the top and back surfaces of an insulating plate. Thereby, each of the circuits corresponding to the two circuit boards is formed on the top and back surfaces of one insulating plate, so that the circuit structure can be made small in size.

However, according to the above-described configuration, since the insulating plate is interposed between both of the circuits, when an electronic part to be connected to both of the circuits is mounted on the circuit structure, it is necessary that, for example, one end of a jumper wire be connected to one terminal of the electronic part connected to a conducting path on one surface of the insulating plate, and the other end of the jumper wire be extended to the other surface of the insulating plate and be connected to a conducting path on the other surface of the insulating plate. Therefore, in the case where a large number of electronic parts are mounted, the process for connecting the jumper wire to the conducting path is troublesome.

DISCLOSURE OF THE INVENTION

The present invention has been made in view of the above circumstances, and accordingly an object thereof is to provide a circuit structure which is made small in size and in which the process for connecting an electronic part to a conducting path is simplified.

A circuit structure in accordance with the present invention includes an insulating plate having openings; a first busbar arranged along a one surface of the insulating plate; a second busbar which is arranged along the other surface of the insulating plate and is exposed in the openings; and an electronic part provided with connection terminals, the connection terminals being electrically connected to the second busbar in the openings.

Thereby, two circuits are formed on both surfaces of one insulating plate, so that the circuit structure can be made small in size as compared with the case where both circuits are formed on separate circuit boards.

Further, the connection terminals of the electronic part are connected directly to the second busbar exposed in the opening formed in the insulating plate in the opening. Thereby, the work process for connecting the electronic part to the second busbar can be simplified.

Also, in the case where circuits are formed on both surfaces of the insulating plate, if an attempt is made to connect both of the circuits to each other, it is necessary to connect the end portion of the busbar on one surface of the insulating plate and one end of a jumper wire to each other and to connect the other end of the jumper wire and the end portion of the busbar on the other surface of the insulating plate to each other, so that the work is troublesome.

In this respect, in the present invention, the configuration is made such that a busbar connecting opening is formed in the insulating plate, either one of the first and second busbars is exposed in the busbar connecting opening, and at least one of the end portions of the other busbar is electrically connected to one busbar in the busbar connecting opening.

Thereby, at least one of the end portions of the busbar arranged on both surfaces of the insulating plate is exposed in the busbar connecting opening, and the other busbar is connected directly to one busbar in the busbar connecting opening without interposing a jumper wire therebetween. Thereby, the work process for connecting busbars arranged on both surfaces of the insulating plate to each other can be simplified.

According to the present invention, the circuit structure can be made small in size, and the process for connecting the electronic part to the busbar can be simplified.

DESCRIPTION OF SYMBOLS

Figure 1:
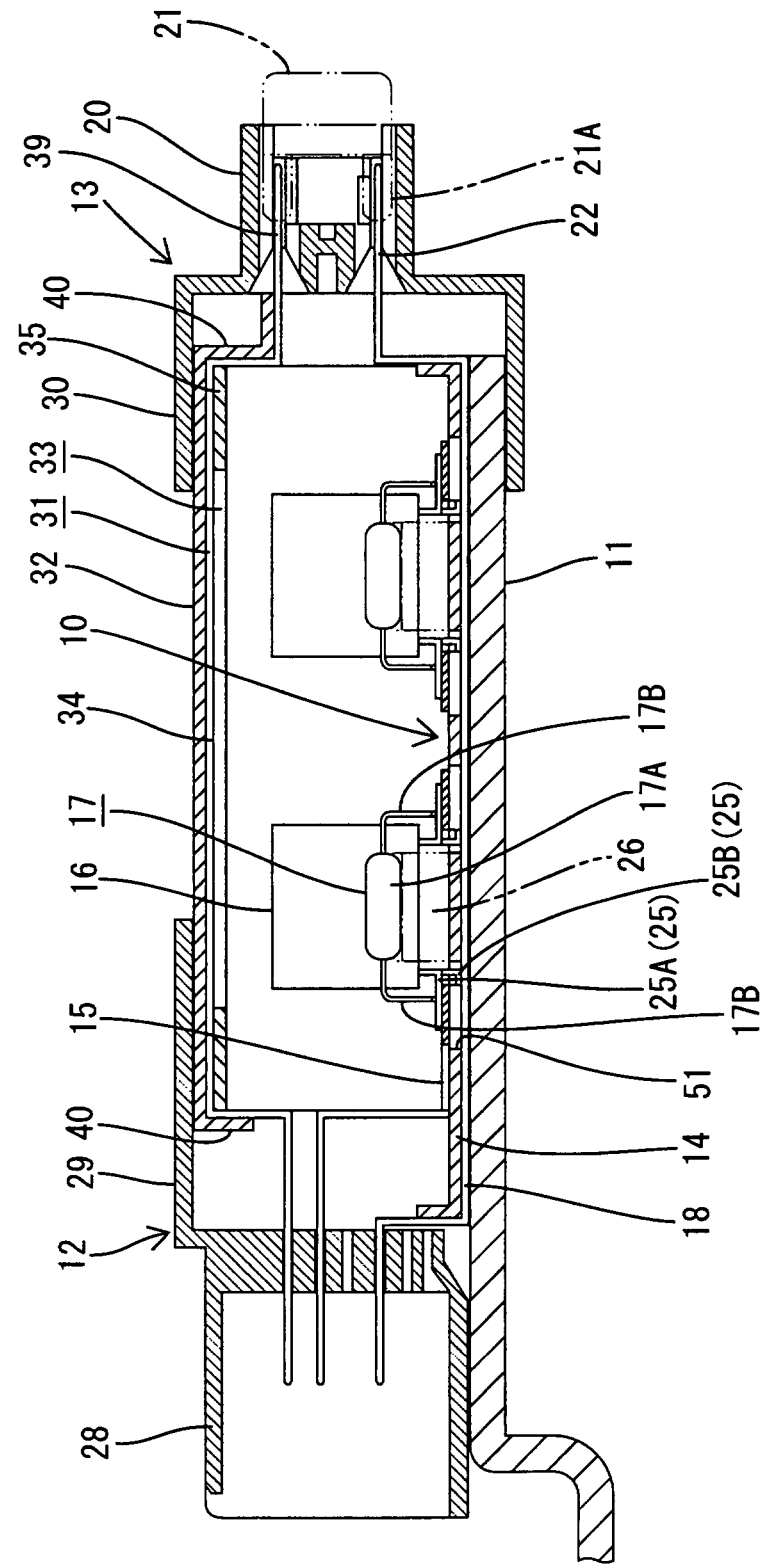
FIG. 1 is a sectional view of a power distribution unit using a circuit structure in accordance with a first embodiment of the present invention.

10 . . . circuit structure
14 . . . insulating plate
15 . . . control busbar (first busbar)
16 . . . relay (electronic part)
17 . . . resistive element (surge absorbing element)
17B . . . terminal
18 . . . power busbar (second busbar)
23 . . . opening
25A . . . control terminal
26 . . . positioning portion
27 . . . groove portion
42 . . . wall portion
50 . . . busbar connecting opening
51 . . . welding opening
52 . . . base portion

BEST MODE FOR CARRYING OUT THE INVENTION

First Embodiment

A first embodiment of the present invention will now be described with reference to FIGS. 1 to 6. In the first embodiment, in a power distribution unit for distributing electric power from a power source, not shown, to a plurality of pieces of electrical equipment, not shown, a radiator plate 11, a connector 12, and a fuse block 13 are mounted on a circuit structure 10 in accordance with the present invention.

Figure 2:
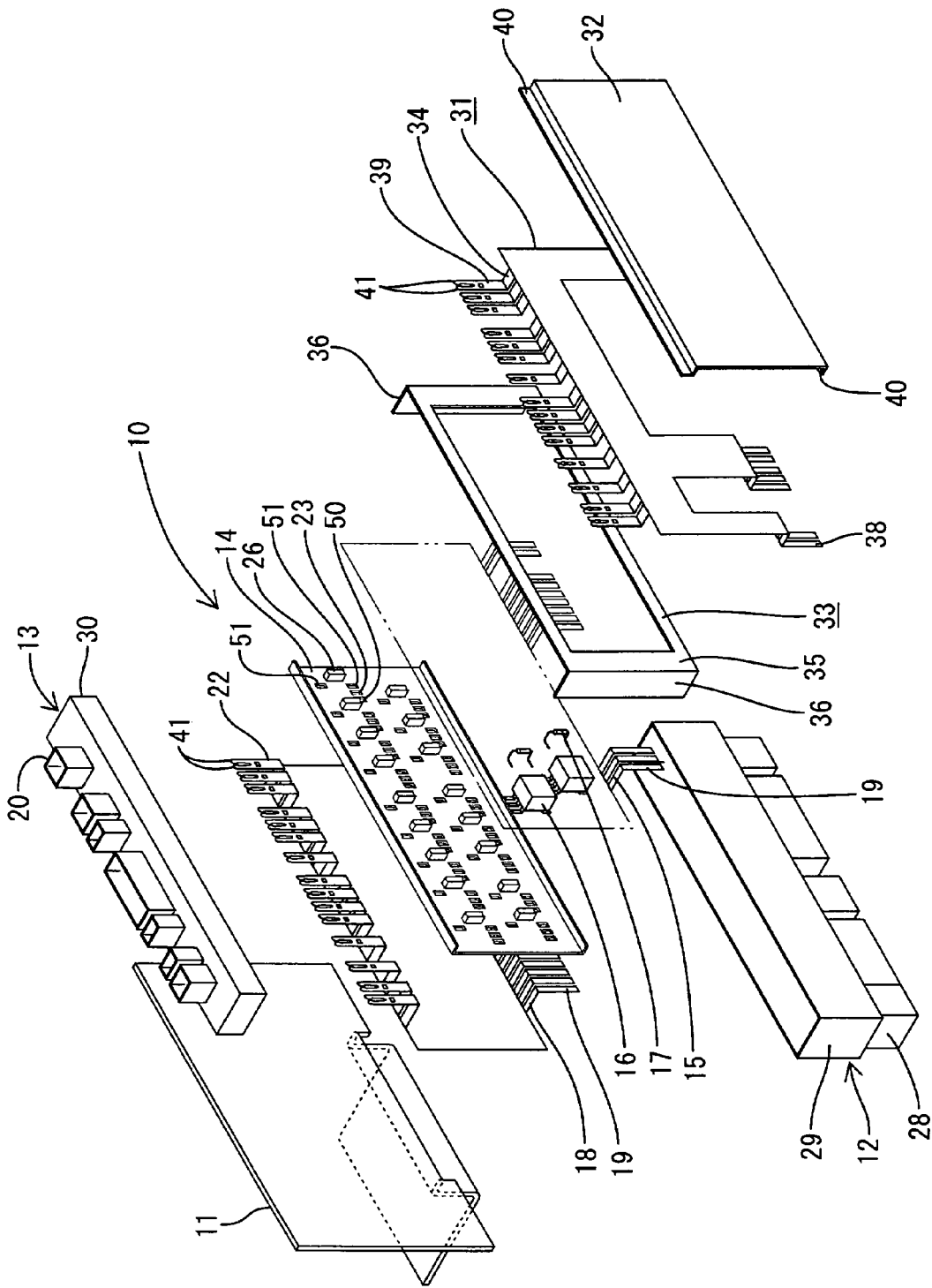
FIG. 2 is an exploded perspective view of the power distribution unit shown in FIG. 1.

As shown in FIG. 1, the circuit structure 10 includes a synthetic resin-made insulating plate 14 having a transversely long and substantially rectangular shape (refer to FIG. 2), a control circuit formed along a plurality of control busbars (corresponding to first busbars in accordance with the present invention) 15 on the upper surface in FIG. 1 (corresponding to a one surface in accordance with the present invention) of the insulating plate 14, relays 16 (corresponding to electronic parts in accordance with the present invention) mounted on this upper surface, and a power circuit formed along a plurality of power busbars (corresponding to second busbars in accordance with the present invention) 18 on the lower surface (corresponding to the other surface in accordance with the present invention) of the insulating plate 14. In FIG. 2, the detailed circuit patterns of the control busbars 15 and the power busbars 18 are omitted.

The control busbar 15 and the power busbar 18 each are formed by blanking a metal sheet into a predetermined shape. The control busbar 15 is bonded onto the upper surface of the insulating plate 14 via a bonding layer, not shown, having insulation properties. On the other hand, the power busbar 18 is bonded onto the lower surface of the insulating plate 14 via a bonding layer, not shown, having insulation properties. The bonding layer may be an adhesive layer applied to only the region to which the control busbars 15 and the power busbars 18 are affixed on the upper and lower surfaces of the insulating plate 14, or may be a bonding sheet provided with openings at positions corresponding to openings 23, busbar connecting openings 50, and welding openings 51, described later.

Some of the tip ends of the control busbars 15 project from the peripheral edge portion of the insulating plate 14 toward the left in FIG. 1 by bending the left end portion in FIG. 1 at right angles two times on the upper surface of the insulating plate 14. Also, Some of the power busbars 18 project to the left from the left end of the insulating plate 14 in FIG. 1, and the tip ends thereof project from the peripheral edge portion of the insulating plate 14 toward the left in FIG. 1 by being bent at right angles two times on the upper surface of the insulating plate 14.

Of the control busbars 15 and the power busbars 18, the end portions projecting from the peripheral edge portion of the insulating plate 14 toward the left in FIG. 1 as described above project in a row in the up and down direction in a connector hood portion 28, described later, and are used as terminal portions 19 connected with the mating terminals, not shown.

Also, Some of tip ends of the power busbars 18 project from the peripheral edge portion of the insulating plate 14 toward the right in FIG. 1 by bending the right end portion in FIG. 1 at right angles two times on the upper surface of the insulating plate 14. These end portions project into fuse mounting portions 20, described later, of the fuse block 13, and are used as fuse connecting portions 22 connected with terminals 21A of the fuses 21. At the tip end of the fuse connecting portion 22, a pair of arm portions 41 are formed. The tip ends of the arm portions 41 project toward the inside so that when the terminal 21A of the fuse 21 is inserted between the arm portions 41, the arm portions 41 holds the terminal 21A of the fuse 21 therebetween (refer to FIG. 2).

In FIG. 1, over the insulating plate 14, a busbar forming plate 31 is held in such a manner as to be separated from the insulating plate 14. The busbar forming plate 31 is formed by holding a plurality of busbars 34 for the forming plate between a plat-shaped synthetic resin-made supporting portion 32 and a synthetic resin-made pressing portion 33. The pressing portion 33 consists of a frame 35 the central portion of which is open and leg portions 36 extending from the end portion on the left front side in FIG. 2 and the end portion on the right far side of the frame 35 toward the insulating plate 14 side. In the lower surface of the supporting portion 32, a groove, not shown, is formed. In the state in which the supporting portion 32 and the pressing portion 33 are assembled to each other, the busbars 34 for the forming plate are housed in this groove, and are held between the supporting portion 32 and the frame 35, by which a circuit pattern is formed, and the busbar forming plate 31 is formed. Since the busbars 34 for the forming plate are in a state in which the periphery thereof is held between the frame 35 and the supporting portion 32 as described above, they can be held stably between the frame 35 and the supporting portion 32. In FIG. 2, the detailed circuit pattern of the busbar forming plate 31 is omitted.

Also, although not shown in detail in the figures, the lower end edges of the leg portions 36 of the pressing portion 33 make contact with the upper surface of the insulating plate 14 from the upside, so that the busbar forming plate 31 is held above the insulating plate 14 along the insulating plate 14 in a state of being separate from the insulating plate 14.

The supporting portion 32 and the leg portions 36 are exposed to the outside of the power distribution unit, and function as a casing for the power distribution unit.

Some of the end portions of the busbars 34 for the forming plate extend from the left end in FIG. 1 of the frame 35, and are bent at right angles two times to the insulating plate 14 side, by which the tip ends thereof are projected from the peripheral edge portion of the busbar forming plate 31 toward the left in FIG. 1. This end portion projects into the connector hood portion 28, and is used as a terminal portion 38 connected with the mating terminal, not shown. The terminal portions 38 are positioned above the terminal portions 19 formed on the control busbars 15 and the power busbars 18.

Some of the end portions of the busbars 34 for the forming plate extend from the right end in FIG. 1 of the frame 35, and are bent at right angles two times to the insulating plate 14 side, by which the tip ends thereof are projected from the peripheral edge portion of the busbar forming plate 31 toward the right in FIG. 1. These end portions project into the fuse mounting portion 20 of the fuse block 13, and are used as fuse connecting portions 39 connected with the terminals 21A of the fuse 21. The fuse connecting portion 39 is formed at a position corresponding to the fuse connecting portion 22 formed on the power busbar 18, and also is positioned above the fuse connecting portion 22 formed on the power busbar 18. At the tip end of the fuse connecting portion 39, a pair of arm portions 41 are formed. The tip ends of the arm portions 41 project toward the inside so that when the terminal 21A of the fuse 21 is inserted between the arm portions 41, the arm portions 41 hold the terminal 21A of the fuse 21 therebetween.

The left end edge of the supporting portion 32 in FIG. 1 is extended toward the lower side, and the right end edge of the supporting portion 32 is extended by being bent at right angles two times to the insulating plate 14 side, so that extension pieces 40 are formed. These extension pieces 40 make contact, from the right and left direction, with portions that are formed by being bent towards the insulating plate 14 side of the busbars 34 for the forming plate, so that the busbars 34 for the forming plate are restrained from being displaced in the right and left direction in FIG. 1.

As shown in FIG. 1, onto the lower surfaces of the power busbars 18, the metallic radiator plate 11 having a substantially rectangular shape (refer to FIG. 2) is bonded via a boding layer, not shown, having insulation properties. The lower surface in FIG. 1 of the radiator plate 11 is exposed to the outside of the power distribution unit, so that heat emitted from the relays 16 and the power busbars 18 is released to the outside of the power distribution unit.

In FIG. 1, on the left-hand side of the circuit structure 10, the connector 12 is attached. The connector 12 consists of the connector hood portion 28 that is open to the left in FIG. 1 and a fitting tubular portion 29 that is open to the right in FIG. 1 and fits to the left end edge of the circuit structure 10 from the left. The above-described terminal portions 19 and terminal portions 38 penetrate the back wall of the connector hood portion 28 and project from the back wall to the left in a row in the up and down direction. On the other hand, in the fitting tubular portion 29, the left end edge of the circuit structure 10 fits tightly.

In FIG. 1, on the right-hand side of the circuit structure 10, the fuse block 13 is attached. The fuse block 13 consists of the fuse mounting portion 20 that is open to the right in FIG. 1 and a fitting tubular portion 30 that is open to the left in FIG. 1 and fits to the right end edges of the circuit structure 10 and the radiator plate 11 from the right. The above-described fuse connecting portions 22 and fuse connecting portions 39 penetrate the back wall of the fuse mounting portion 20 and project to the right into the fuse mounting portion 20 in a row in the up and down direction, being connected with the terminals 21A of the fuse 21. Also, in the fitting tubular portion 30, the left end edges of the circuit structure 10 and the radiator plate 11 fit tightly.

As shown in FIG. 1, the fuse mounting portion 20 contains the fuse 21. Each of the terminals 21A of the fuse 21 is inserted between the arm portions 41 of the fuse connecting portion 22 on the power busbar 18 side, and also inserted between the arm portions 41 of the fuse connecting portion 39 on the busbar 34 side, by which the busbar forming plate 31 and the power circuit are electrically connected to each other.

Figure 6:
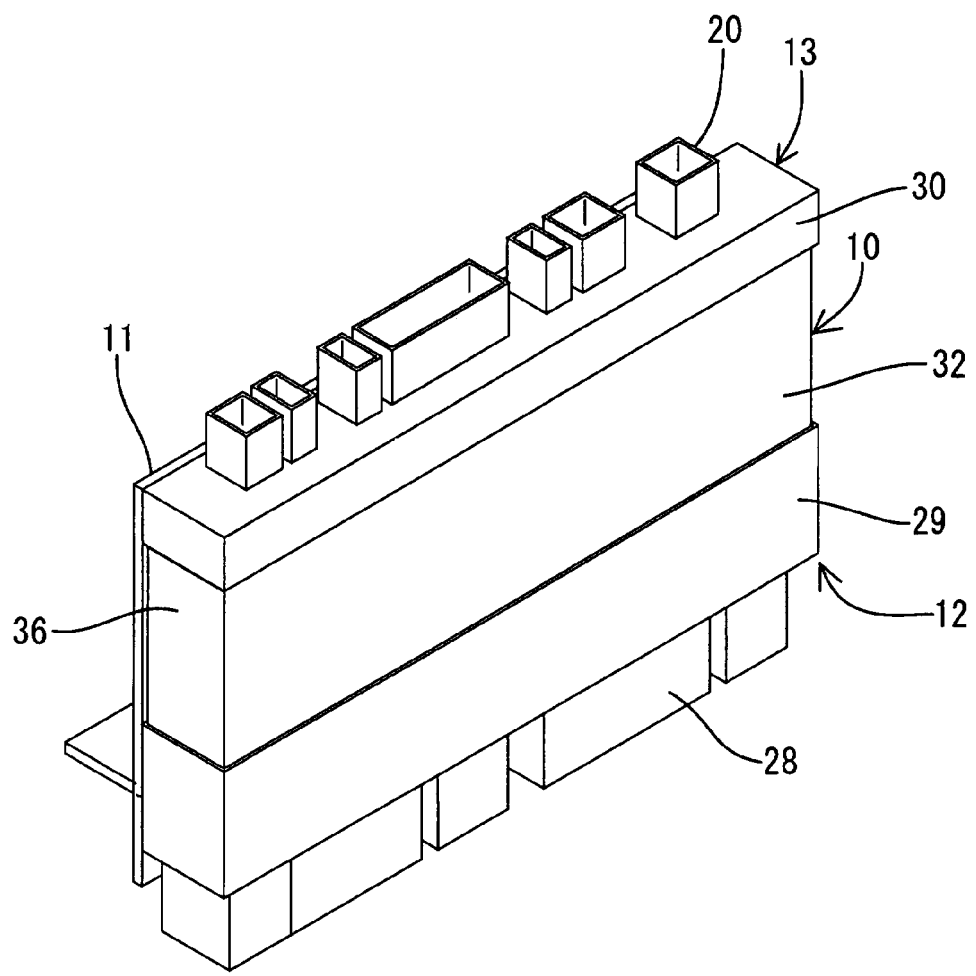
FIG. 6 is a perspective view of the power distribution unit shown in FIG. 1.

As shown in FIG. 6, the power distribution unit is arranged so as to adopt a vertical posture such that the fuse block 13 side is directed upward, and is fixed in an engine room, not shown, in a state of being housed in a relay box, not shown.

Figure 3:
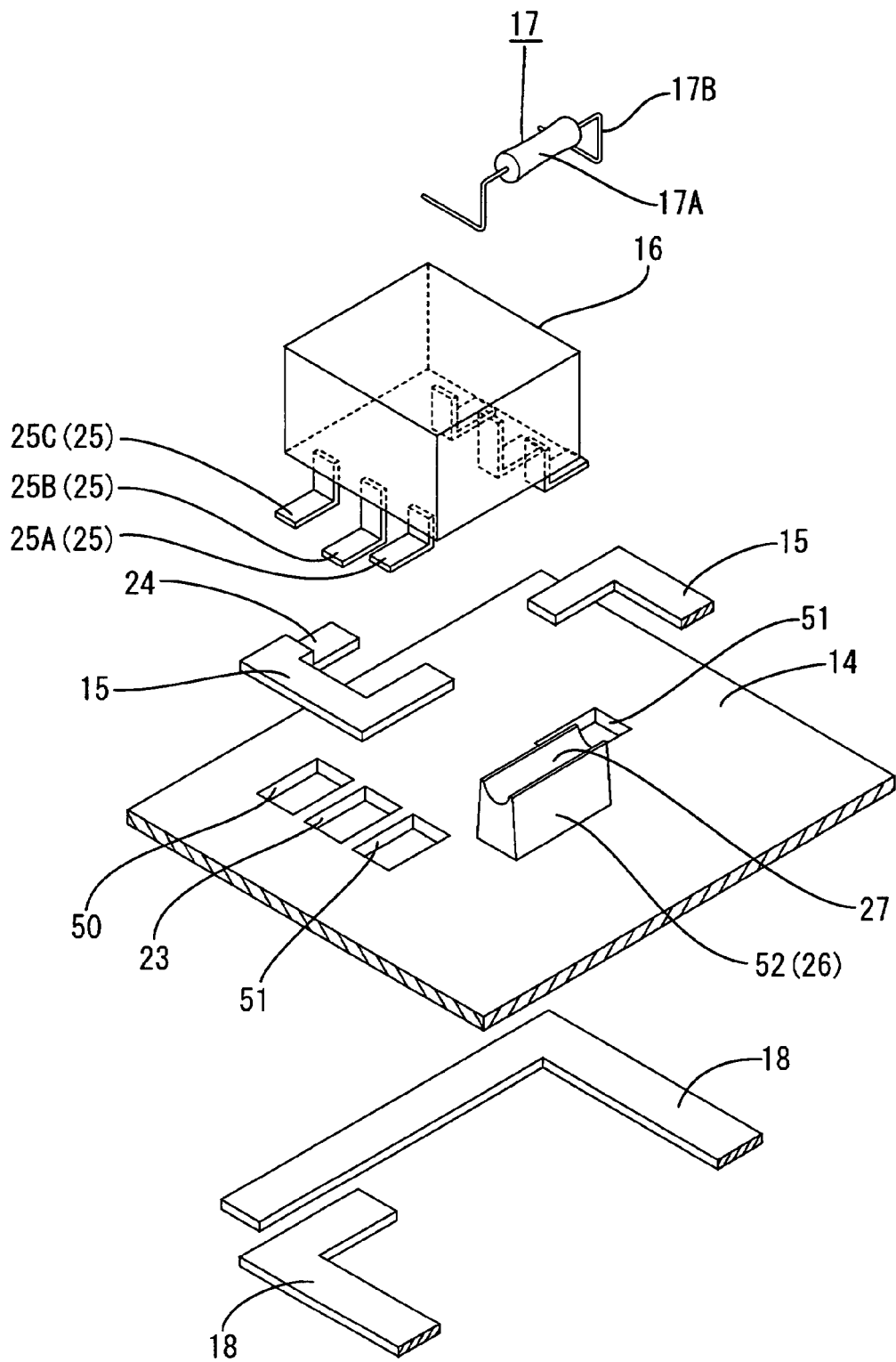
FIG. 3 is a partially enlarged exploded perspective view of the circuit structure shown in FIG. 1.
Figure 4:
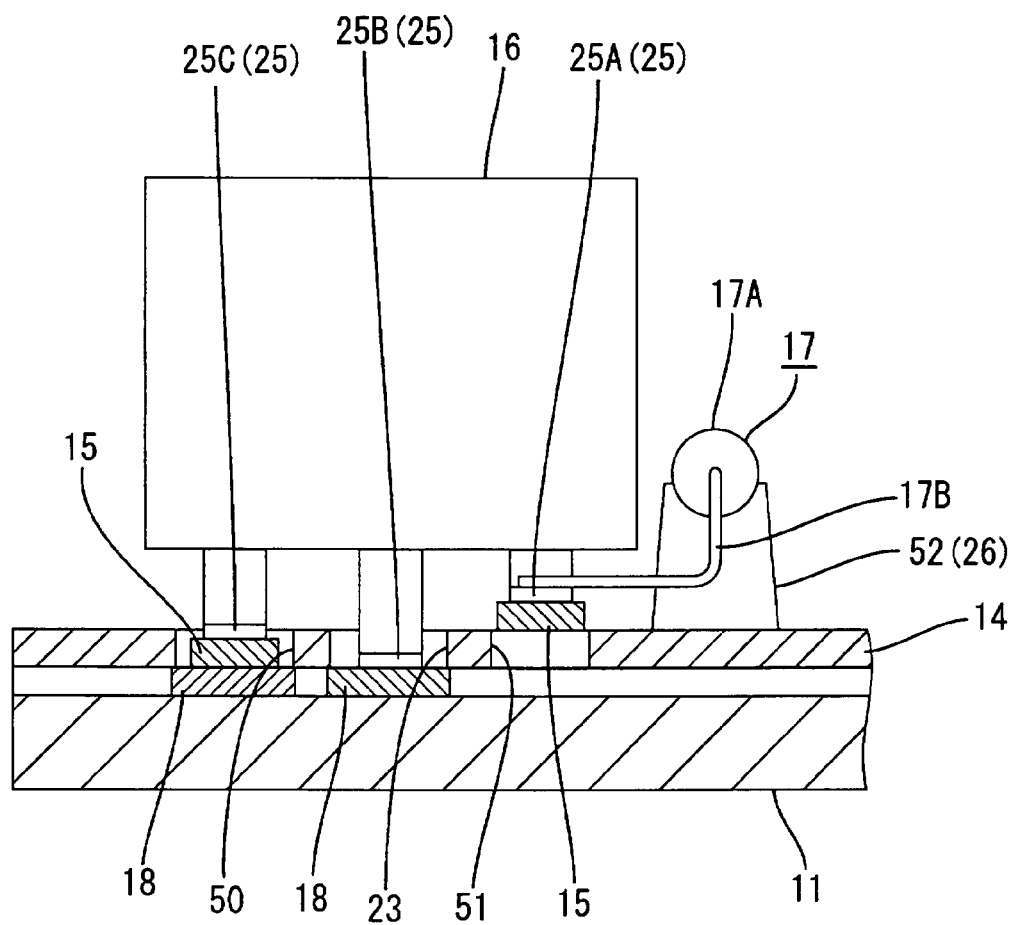
FIG. 4 is a partially enlarged sectional view of the circuit structure shown in FIG. 1.
Figure 5:
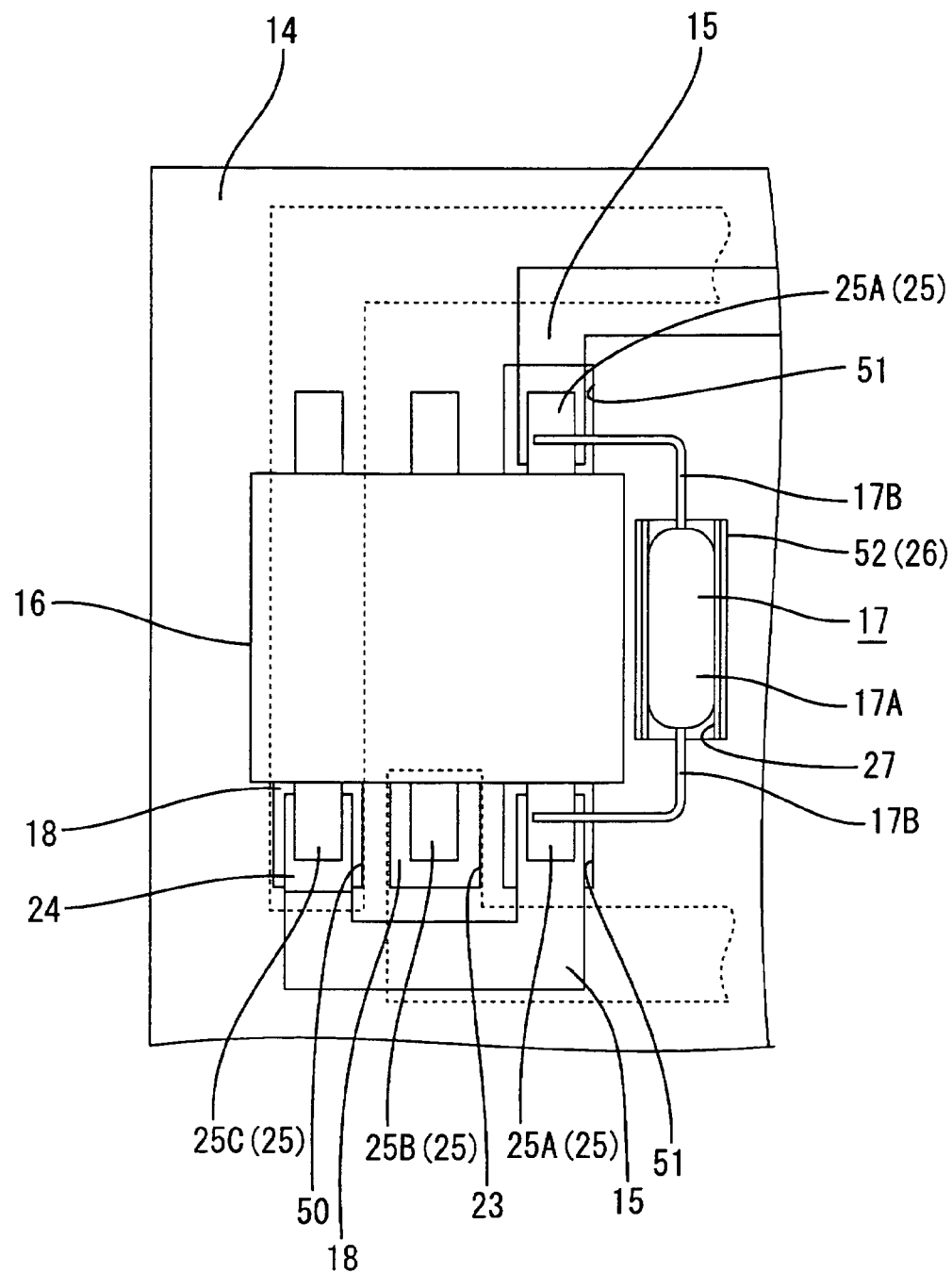
FIG. 5 is a partially enlarged plan view of the circuit structure shown in FIG. 1.

As shown in FIGS. 3 to 5, the insulating plate 14 is formed with the opening 23 at a predetermined position, and the opening 23 is set so as to have a size capable of housing a terminal 25 of the relay 16. Also, the insulating plate 14 is formed with the busbar connecting opening 50 at a predetermined position. From the opening 23 and the busbar connecting opening 50, the power bus bars 18 are exposed. As described above, the power busbars 18 are bonded by an adhesive applied to the region to which the power busbars 18 are affixed on the lower surface of the insulating plate 14 or by a bonding sheet provided with openings at positions corresponding to the opening 23 and the busbar connecting openings 50. Therefore, the bonding layer does not stick to the upper surfaces of the power busbars 18 exposed from the opening 23 and the busbar connecting openings 50.

Also, a predetermined end portion 24 of the control busbar 15 is formed so as to lower one step to the downside, and is housed in the busbar connecting opening 50, being connected to the power busbar 18.

On the upper surface of the insulating plate 14, the relay 16 is mounted. From the relay 16, a plurality of (six in this embodiment) terminals 25 are extended. The terminal 25 arranged on the rightmost side of the terminals 25 extended from the upper edge of the relay 16 to the upside in FIG. 5 and the terminal 25 arranged on the rightmost side of the terminals 25 extended from the lower edge of the relay 16 to the downside in FIG. 5 are used as a pair of control terminals 25A through which a signal for controlling the operation of the relay 16 is sent from the control circuit. One of the control terminals 25A is welded to the upper surface of one of the control busbars 15 in a lapped manner, and the other of the control terminals 25A is welded to the upper surface of the other of the control busbars 15 in a lapped manner.

Also, the terminal 25 arranged in the center in the right and left direction in FIG. 5 of the terminals 25 extended from the lower edge of the relay 16 to the downside in FIG. 5 is used as a power terminal 25B for controlling the energization/de-energization of the power circuit. This power terminal 25B is housed in the opening 23 in the insulating plate 14, and is welded to the upper surface of the power busbar 18 in a lapped manner.

Further, the terminal 25 arranged on the leftmost side of the terminals 25 extended from the lower edge of the relay 16 to the downside in FIG. 5 is used as a terminal 25C connected with both of the control circuit and the power circuit. This terminal 25C is housed in the busbar connecting opening 50, and is further lapped on the upper surface of the end portion 24 of the control busbar 15 that is lapped on the power busbar 18, so that the power busbar 18, the control busbar 15, and the terminal 25C are welded at the same time.

On the upper surface of the insulating plate 14, there is mounted a resistive element 17 (corresponding to a surge absorbing element in accordance with the present invention) that is connected to the control circuit to protect the relay 16 from a surge current (a current caused to flow by an aperiodic transient voltage rising suddenly for a short period of time) caused by the energization/de-energization control. The resistive element 17 is arranged adjacently to the side edge on the side on which the control terminals 25A are formed of the relay 16. In this embodiment, the resistive element 17 is arranged at the right side of the relay 16 in FIG. 5. The resistive element 17 consists of a body 17A having a substantially cylindrical shape that is long in the horizontal direction and a pair of terminals 17B extending from both ends in the lengthwise direction of the body 17A.

On the upper surface of the insulating plate 14, a positioning portion 26 is formed to position and mount the resistive element 17 at a predetermined position. The positioning portion 26 consists of a groove portion 27 formed on the upper surface of a base portion 52 formed so as to project from the upper surface of the insulating plate 14 to the upside. The base portion 52 has a substantially rectangular parallelepiped shape that is long in the right and left direction in FIG. 1. The groove portion 27 is formed along the lengthwise direction of the base portion 52 so that the body 17A of the resistive element 17 can be placed in the groove portion 27. The length dimension in the lengthwise direction of the base portion 52 is set so as to be slightly larger than the length dimension in the lengthwise direction of the body 17A of the resistive element 17. Also, the width dimension of the groove portion 27 is set so as to be approximately equal to the width dimension of the body 17A of the resistive element 17.

As shown in FIGS. 3 to 5, the terminals 17B of the resistive element 17 are extended from both ends of the groove portion 27, then being bent downward in FIG. 4, and the lower ends thereof are further bent at right angles in the direction in which the relay 16 is arranged (to the left in FIG. 5). The resistive element 17 is configured so that when the body 17A thereof is placed in the groove portion 27, the paired terminals 17B are lapped on the paired control terminals 25A. The control busbar 15, the control terminal 25A of the relay 16, and the terminal 17B of the resistive element 17 are electrically connected by being welded. The insulating plate 14 is formed with the welding openings 51, which are used for inserting a welding jig, not shown, from the back surface of the insulating plate 14, at positions corresponding to the control terminals 25A of the relay 16. Thereby, the control busbar 15, the control terminal 25A of the relay 16, and the terminal 17B of the resistive element 17 can be welded at the same time while a pressure is applied by holding these three elements in the up and down direction using the welding jig.

Next, the operation and effects of the first embodiment is explained.

First, the insulating plate 14 is formed by injection molding a synthetic resin. In the insulating plate 14, the opening 23, the busbar connecting opening 50, and the welding openings 51 are formed at the predetermined positions, and the positioning portion 26 is formed in the vicinity of the welding openings 51.

Successively, the control busbars 15 are formed by blanking a metal sheet into a predetermined shape. The control busbars 15 are bonded onto the upper surface in FIG. 1 of the insulating plate 14. At this time, the end portion 24 to be connected to the power busbar 18 of the control busbar 15 is housed in the busbar connecting opening 50. Also, the end portions to be connected to the control terminals 25A of the relay 16 are arranged above the welding openings 51.

Also, the power busbars 18 are formed by blanking a metal sheet into a predetermined shape. The power busbars 18 are bonded onto the lower surface of the insulating plate 14. At this time, the power busbars 18 are exposed in the opening 23 and the busbar connecting opening 50.

After the control busbars 15 and the power busbars 18 have been bonded onto the insulating plate 14, the relay 16 is placed on the upper surface of the insulating plate 14 from above the insulating plate 14. At this time, the power terminal 25B of the terminals 25 of the relay 16 is arranged so as to be housed in the opening 23, and also the terminal 25C connected to both of the control circuit and the power circuit is arranged so as to be housed in the busbar connecting opening 50. By doing this, the power terminal 25B is lapped on the upper surface of the power busbar 18, and also the terminal 25C connected to both of the control circuit and the power circuit is further lapped on the upper surface of the end portion 24 of the control busbar 15 lapped on the power busbar 18. On the other hand, the control terminals 25A of the relay 16 are arranged above the welding openings 51, and are lapped on the upper surfaces of the control busbars 15.

After the relay 16 has been positioned, the body 17A of the resistive element 17 is positioned in the groove portion 27. At this time, the terminals 17B of the resistive element 17 are arranged so as to be lapped on the upper surfaces of the control terminals 25A of the relay 16.

Next, one of a pair of welding jigs is inserted into the busbar connecting opening 50 from the downside and is brought into contact with the lower surface of the power busbar 18 from the downside, and also the other of the welding jigs is brought into contact with the upper surface of the terminal 25C of the relay 16 from the upside. Thereafter, the power busbar 18, the control busbar 15, and the terminal 25C of the relay 16 are welded at the same time by melting the connection surfaces with ultrasonic waves while a pressure is applied by holding these three elements in the up and down direction using the welding jigs. Thereby, the power busbar 18, the control busbar 15, and the terminal 25C of the relay 16 are connected electrically.

Also, one of the paired welding jigs is inserted into the opening 23 from the downside and is brought into contact with the lower surface of the power busbar 18 from the downside, and also the other of the welding jigs is brought into contact with the upper surface of the power terminal 25B of the relay 16 from the upside. Thereafter, in the same way as described above, the power busbar 18 and the power terminal 25B of the relay 16 are electrically connected by performing ultrasonic welding at the same time.

Also, one of the paired welding jigs is inserted into the welding opening 51 from the downside and is brought into contact with the lower surface of the control busbar 15 from the downside, and also the other of the welding jigs is brought into contact with the terminal 17B of the resistive element 17. Thereafter, in the same way as described above, the power busbar 18, the control terminal 25A of the relay 16, and the terminal 17B of the resistive element 17 are electrically connected by performing ultrasonic welding at the same time.

In the above-described welding work, for example, a procedure is conceivable in which a printed wiring board in which circuits are formed on the upper and lower surfaces thereof is cut using laser beams or a drill from the upper surface of the printed wiring board, a copper foil formed on the lower surface of the printed wiring board is exposed, and welding work is performed on this copper foil. In this case, however, since an adhesive has been applied on the upper surface of the copper foil, the work for removing the adhesive is needed to weld the copper foil to the control terminal 25A or the terminal 17B.

In contrast, in this embodiment, since the bonding layer does not stick to the upper surface of the power busbar 18 exposed in the opening 23 and the busbar connecting opening 50 as described above, the work for removing the adhesive layer is not needed, so that the welding work can be performed easily.

As described above, according to the first embodiment, the control circuit is formed on the upper surface of the insulating plate 14 by the control busbar 15, and also the power circuit is formed on the lower surface thereof by the power busbar 18. Thereby, the circuit structure can be made small in size as compared with the case where each of these circuits is formed on a separate circuit board.

Also, according to the first embodiment, the power terminal 25B of the relay 16 is housed in the opening 23 and is welded to the power busbar 18. Therefore, the number of connecting locations can be reduced, and hence the connecting work process can be simplified as compared with the case where the power circuit and the power terminal 25B of the relay 16 are connected to each other, for example, by a jumper wire. Furthermore, since the power busbar 18, the end portion 24 of the control busbar 15, and the terminal 25C of the relay 16 are welded in the busbar connecting opening 50, the connecting work process at the time when the control circuit and the power circuit are connected to each other can also be simplified in the same way as described above.

Also, according to the first embodiment, since the resistive element 17 can be placed at the predetermined position of the insulating plate 14 by the positioning portion 26, the positional shift of the resistive element 17 occurring before the resistive element 17 is fixed to the insulating plate 14 can be prevented.

Further, the body 17A of the resistive element 17 is easy to roll because it has a substantially cylindrical shape that is long in the horizontal direction. In this respect, in the first embodiment, the groove portion 27 is formed in the upper surface of the base portion 52. Therefore, by placing the body 17A of the resistive element 17 in the groove portion 27, the resistive element 17 can be prevented from rolling.

In addition, since the insulating plate is formed by injection molding a synthetic resin, the positioning portion 26 can be formed in such a manner as to project upward from the insulating plate 14. Thereby, when the resistive element 17 is assembled from the upper surface of the insulating plate 14, the resistive element 17 can be placed easily in the groove portion 27.

Also, conventionally, the resistive element 17 has been connected to the control circuit of the insulating plate 14, and electrically connected to the control terminal 25A of the relay 16 via the conducting path of this control circuit. According to the first embodiment, since the terminal 17B of the resistive element 17, the control terminal 25A, and the control busbar 15 are welded at the same time, the connecting work can be performed efficiently as compared with the case where the terminal 17B, the control terminal 25A, and the control busbar 15 are connected individually. Also, a conducting path for electrically connecting the resistive element 17 to the control terminal 25A can be omitted.

Second Embodiment

Figure 7:
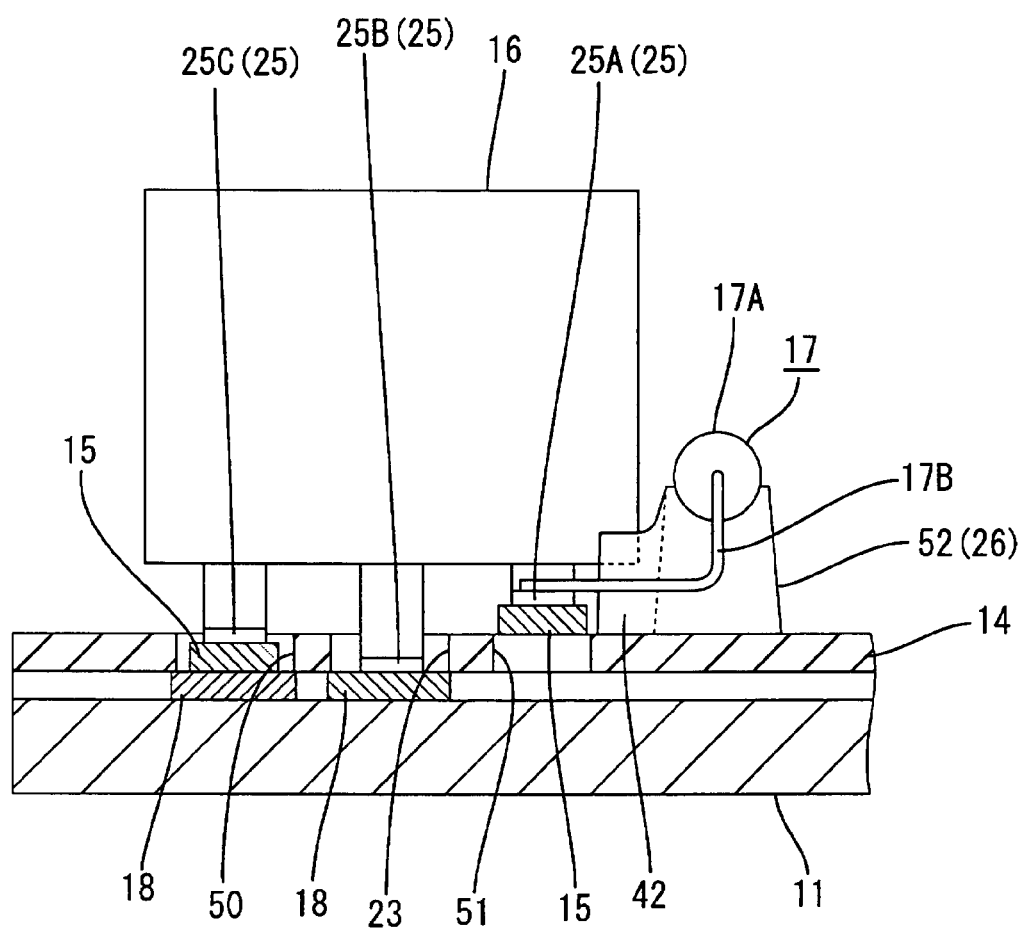
FIG. 7 is a partially enlarged sectional view of a circuit structure in accordance with a second embodiment of the present invention.

Next, a second embodiment of the present invention is explained with reference to FIGS. 7 and 8. The second embodiment differs from the first embodiment in that the shape of the positioning portion 26 is different. Other configurations are the same as those of the first embodiment. The same symbols are applied to elements that are the same as those of the first embodiment, and the duplicated explanation is omitted.

Figure 8:
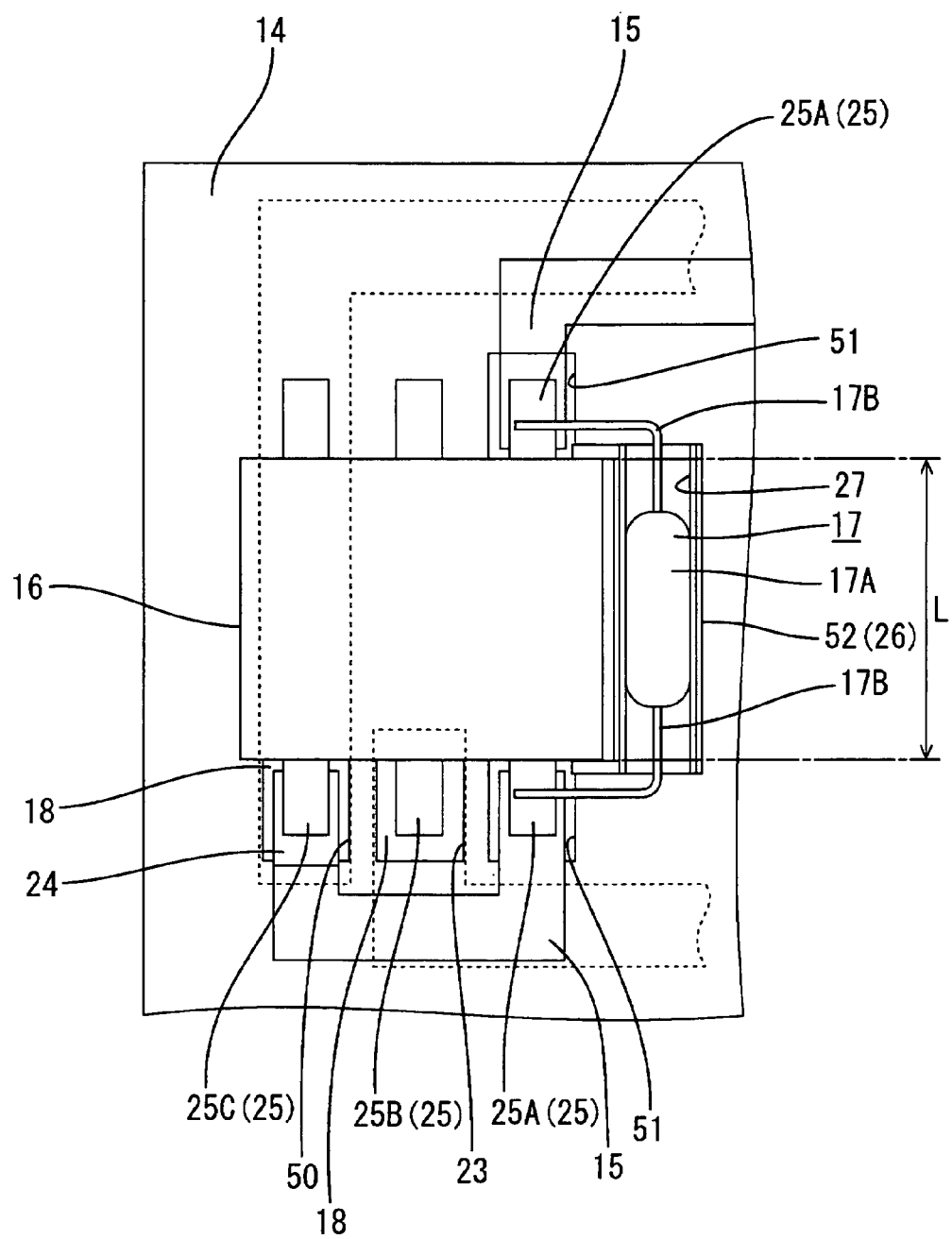
FIG. 8 is a partially enlarged plan view of the circuit structure shown in FIG. 7.

From the upper and lower ends in FIG. 8 of the positioning portion 26, a pair of wall portions 42 are formed in the direction in which the relay 16 is disposed. The wall portions 42 project upward from the upper surface of the insulating plate 14 in FIG. 7, and are formed so as to face to each other. The distance L between the wall portions 42 is set so as to be equal to the vertical length dimension in FIG. 8 of the relay 16. Also, the length dimension in the lengthwise direction of the positioning portion 26 is set so as to be slightly larger than the vertical length dimension of the relay 16 in FIG. 8. On the other hand, as shown in FIG. 7, the height dimension from the upper surface of the insulating plate 14 of the wall portion 42 is set so that the upper end edge of the wall portion 42 is located above the lower end edge of the relay 16.

Next, the operation and effects of the second embodiment is explained.

According to the second embodiment, when the relay 16 is mounted on the insulating plate 14, first, the relay 16 is placed on the upper surface of the insulating plate 14 while being brought into contact with the inner wall surfaces of the wall portions 42. Thereby, the relay can be positioned at the predetermined position. Next, in the state in which the relay 16 is positioned, the relay 16 is welded to the resistive element 17, the control circuit, and the power circuit, by which the relay 16 is fixed to the insulating plate 14. Thereby, the positional shift of the relay 16 occurring before the relay 16 is fixed to the insulating plate 14 can be prevented.

Third Embodiment

Figure 9:
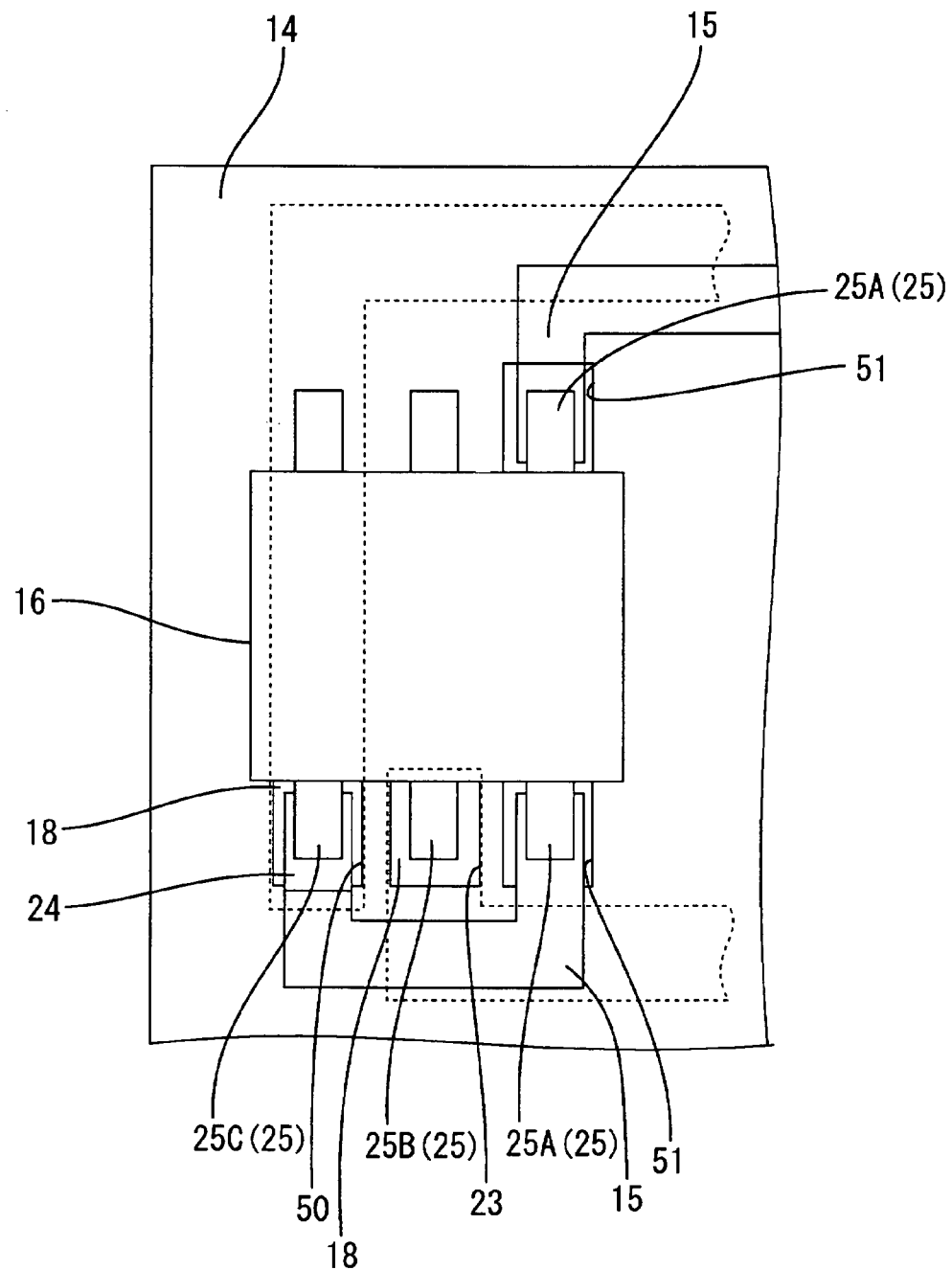
FIG. 9 is a partially enlarged plan view of a circuit structure in accordance with a third embodiment of the present invention.

In the first embodiment, the configuration is such that the resistive element 17 is mounted to protect the relay 16 from a surge current. However, in the case where the configuration is such that a surge current does not flow directly to the control terminal 25A of the relay 16, for example, in the case where a circuit for restraining the occurrence of surge current is provided, the resistive element 17 can be omitted as shown in FIG. 9. Also, the positioning portion 26 for positioning the resistive element 17 can be omitted.

Thereby, the circuit structure 10 can be made small in size.

Other Embodiments

The present invention is not limited to the embodiments having been explained by the above description and the drawings. For example, embodiments described below are also within the technical scope of the present invention.

(1) In the above-described embodiments, the relay 16 is used as an electronic part. However, the configuration is not limited to this, and a semiconductor relay may be used. In this case, the configuration may be such that the source terminal and the drain terminal of the semiconductor relay are housed in the opening 23 in the insulating plate 14 and are connected to the power busbar 18, and the gate terminal thereof is connected to the control busbar 15. Further, the drain terminal is arranged on the bottom surface of the semiconductor relay, and the whole semiconductor relay is housed in the opening 23, therefore the height of the circuit structure can be decreased.

(2) In the above-described embodiments, the positioning portion 26 is formed so as to project upward from the upper surface of the insulating plate 14. However, the configuration is not limited to this. The configuration may be such that a groove for placing the body 17A of the resistive element 17 is formed in the upper surface of the insulating plate 14.

(3) In the above-described embodiment, the wall portion 42 consists of paired wall portions that are formed so as to project upward from the upper surface of the insulating plate 14 and to face each other. However, the configuration is not limited to this. The wall portion 42 may be a wall portion adopting a straight line shape as viewed from the above, or may be a wall portion adopting a substantially U shape as viewed from the above. Alternatively, four wall portions may be connected to form a tubular shape. The wall portion 42 may have any shape if it can position and hold the relay 16 at the predetermined position.

(4) In the above-described embodiments, the terminals 25 of the relay 16, the power busbars 18, the control busbars 15, and the terminals 17B of the resistive element 17 are connected by ultrasonic welding. However, the configuration is not limited to this, and these elements may be connected by laser welding, arc welding, or resistance welding. Also, these elements may be connected by brazing, soldering, or the like.

(5) In the above-described embodiments, the control busbar 15, the power busbar 18, and the terminal 25C of the relay 16 are housed in one busbar connecting opening 50, and are connected collectively. However, the configuration is not limited to this. The busbar connecting opening 50 for connecting the control busbar 15 to the power busbar 18 and the opening 23 for connecting the power busbar 18 to the terminal 25C of the relay 16 may be formed separately.

(6) In the above-described embodiments, the welding opening 51 is provided at a position corresponding to the control terminal 25A of the relay 16 of the insulating plate 14, and welding jigs are inserted into the welding opening 23A to weld the terminal 17B of the resistive element 17, the control terminal 25A, and the control busbar 15 while pressure is applied by holding these three elements using the paired welding jigs. However, the welding opening 51 can be omitted if a method such as laser welding is used, in which the three elements can be welded without applying pressure using the jigs.

(7) In the above-described embodiments, the power busbar 18 is exposed in the busbar connecting opening 50 provided in the insulating plate 14. However, the configuration is not limited to this. The configuration may be such that the control busbar 15 is exposed in the busbar connecting opening 50, and the power busbar 18 is housed in the busbar opening 50 and is connected to the control busbar 15.

(8) In the above-described embodiments, the control busbars 15 and the power busbars 18 are disposed on the upper surface and the lower surface of the insulating plate 14, respectively, via the bonding layer. However, the configuration is not limited to this. The configuration may be such that after resin pins have been erectingly provided at predetermined positions on the upper and lower surfaces of the insulating plate 14, and the control busbars 15 and the power busbars 18 have been arranged at predetermined positions, the heads of the resin pins have been deformed by melting or pressurizing, and the control busbars 15 and the power busbars 18 are arranged along the upper and lower surfaces of the insulating plate 14 by holding the control busbars 15 and the power busbars 18 between the deformed heads of the resin pins and the upper surface and lower surface of the insulating plate 14.

(9) The control busbars (corresponding to the second busbars in accordance with the present invention) may be constructed such that they are arranged on the lower surface (corresponding to the other surface in accordance with the present invention) and are exposed in the opening 23, the resistive element 17 is placed at the upper end of the positioning portion 26, the terminal 17B of the resistive element 17 is housed in the opening 23, the control terminal 25A of the relay 16 is housed into the opening 23 from the upside, and the end terminal 17B is welded to be held between the control busbar and the control terminal 25A, by which the terminal 17B, the control busbar, and the control terminal 25A are connected electrically.

The present invention provides a circuit structure which is made small in size and in which the process for connecting the electronic part to the conducting path is simplified.

What is claimed is:

1. A circuit structure comprising:
   an insulating plate having openings;
   a first busbar positioned on a first surface of the insulating plate;
   a second busbar positioned on a second surface of the insulating plate, wherein a portion of the second bus bar is positioned over the openings; and
   an electronic part provided with connection terminals, the connection terminals being electrically connected to the portion of the second busbar positioned over the openings;
   the first surface of the insulating plate includes a positioning portion for bringing the electronic part into contact with the insulating plate and positioning the electronic part; and
   the positioning portion is provided so as to project from the first surface of the insulating plate such that the positioning portion is between part of the electronic part and the insulating plate.

2. The circuit structure according to claim 1, wherein a busbar connecting opening is formed in the insulating plate, a portion of at least one of the first and second busbar is positioned over the busbar connecting opening; and at least one of the end portions of the other busbar is electrically connected to the portion of the busbar over the busbar connecting opening.

3. The circuit structure according to claim 1, wherein the electronic part is a resistive element; and
   the positioning portion includes a groove portion formed on the upper surface of a base portion, the base portion provided so as to project from the first surface of the insulating plate.

4. The circuit structure according to claim 2, wherein the electronic part is a resistive element; and
   the positioning portion consists of a groove portion formed on the upper surface of a base portion, the base portion provided so as to project from the first surface of the insulating plate.

5. The circuit structure according to claim 1, wherein the electronic part is a relay; and
   the positioning portion includes a pair of wall portions provided so as to project from the first surface of the insulating plate.

6. The circuit structure according to claim 2, wherein the electronic part is a relay; and
   the positioning portion includes a pair of wall portions provided so as to project from the first surface of the insulating plate.

7. The circuit structure according to claim 6, wherein the relay includes a pair of control terminals that is mounted on the first surface of the insulating plate; the first busbar provided in plural numbers, one of the plurality of first busbars being connected to one of the control terminals, and another of the plurality of first busbars being connected to the other of the control terminals; a surge absorbing element having a pair of leads connected between the control terminals; and the lead of the surge absorbing element connected simultaneously by a process in which the control terminal of the relay and the first busbar are connected by at least one of welding or brazing.

8. The circuit structure according to claim 7, wherein the insulating plate is formed with a welding opening, which is used for inserting a welding jig in one of the first and second surface of the insulating plate, at a position corresponding to the control terminal.

* * * * *